US006762362B1

United States Patent
Cavanaugh et al.

(10) Patent No.: US 6,762,362 B1
(45) Date of Patent: Jul. 13, 2004

(54) APPARATUS AND METHOD FOR CONNECTING A POWER SUPPLY TO MULTIPLE BACKPLANES WITHIN AN ELECTRONIC EQUIPMENT CABINET

(75) Inventors: Barry Cavanaugh, Douglas, MA (US); Keith Johnson, Medway, MA (US)

(73) Assignee: EMC Corporation, Hopkinton, MA (US)

( * ) Notice: Subject to any disclaimer, the term of this patent is extended or adjusted under 35 U.S.C. 154(b) by 339 days.

(21) Appl. No.: 09/864,481

(22) Filed: May 24, 2001

(51) Int. Cl.[7] .............................. H02G 5/00; H02R 4/00
(52) U.S. Cl. ................ 174/68.2; 174/71 B; 174/149 B; 361/611; 361/637; 439/212
(58) Field of Search .............................. 174/68.2, 70 B, 174/71 B, 72 B, 88 B, 99 B, 129 B, 149, 149 B; 361/611, 624, 637, 639, 650, 658, 825, 826; 439/212

(56) References Cited

U.S. PATENT DOCUMENTS

| | | | | |
|---|---|---|---|---|
| 2,997,627 A | * | 8/1961 | Ellegood | 361/614 |
| 3,349,291 A | * | 10/1967 | Olashaw | 361/624 |
| 4,079,439 A | * | 3/1978 | Coles et al. | 361/637 |
| 4,121,276 A | * | 10/1978 | Kovatch et al. | 361/614 |
| 5,011,421 A | * | 4/1991 | Duke et al. | 439/213 |
| 5,157,584 A | * | 10/1992 | Rowe | 361/638 |
| 5,749,671 A | * | 5/1998 | Chauquet | 403/384 |
| 5,949,641 A | * | 9/1999 | Walker et al. | 361/600 |
| 6,445,571 B1 | * | 9/2002 | Inniss et al. | 361/624 |
| 6,506,068 B2 | * | 1/2003 | Wagener | 439/213 |

* cited by examiner

Primary Examiner—Dean A. Reichard
Assistant Examiner—Adolfo Nino
(74) Attorney, Agent, or Firm—Chapin & Huang, L.L.C.; David E. Huang, Esq.

(57) ABSTRACT

An electronic system has a power supply, multiple backplanes, and a bus bar assembly electrically interconnected between the power supply and the multiple backplanes. The bus bar assembly includes a power supply member that couples to a power supply and a backplane member that couples simultaneously to multiple backplanes. The backplane member defines multiple rows of holes. Each row of holes includes at least two holes. The bus bar assembly further includes a set of fasteners that fasten the power supply member to the backplane member in order to provide a conductive path between the power supply and the multiple backplanes. The multiple rows of holes defined by the backplane member enable the backplane member to fasten to power supply members having different designs for flexibility.

29 Claims, 7 Drawing Sheets

APPARATUS AND METHOD FOR CONNECTING A POWER SUPPLY TO MULTIPLE BACKPLANES WITHIN AN ELECTRONIC EQUIPMENT CABINET

BACKGROUND OF THE INVENTION

A typical electronic system (e.g., a computer system, a data storage system. etc.) includes one or more backplanes and electronic components which connect with the backplanes (e.g., circuit boards, disk drive assemblies, etc.). Typically, such a system further includes a power supply, and bus bar assemblies that connect the power supply to the backplanes.

One conventional data storage system includes an electronic equipment cabinet a power supply disposed at the bottom of the cabinet, two backplanes (i.e., a first backplane and a second backplane) disposed above the power supply, and multiple bus bar assemblies. The backs of the first and second backplanes face each other, and include power supply pads.

The bus bar assemblies extend in a parallel configuration between the first and second backplanes. That is each bus bar assembly includes a vertical conductive beam that (i) fastens to the power supply (ii) extends through the middle of the cabinet in a parallel-manner to the vertical conductive beams of neighboring bus bar assemblies and (iii) attaches to the top of the cabinet for support. The vertical conductive beams of the bus bar assemblies extend in parallel within a plane between the backplanes thus preventing them from interfering with each other. Each bus bar assembly further includes a conductive that connects to the vertical conductive beam of that bus bar assembly and extends laterally to the power supply pads on the backs of the first and second backplanes.

Each conductive bracket of a bus bar assembly includes a single vertical row of holes which align with a corresponding vertical row of holes in the vertical conductive beam of that bus bar assembly. A set of screws thread through the conductive bracket holes into the vertical conductive beam holes in order to fasten the conductive bracket to the vertical conductive beam. Accordingly, each bus bar assembly provides an electrical pathway (through a vertical conductive beam and a conductive bracket) between the power supply and the two backplanes. In particular a first bus bar assembly carries a +5 Volt signal from the power supply to the backplanes, and a second bus bar assembly provides a return path (i.e., Ground) for the +5 Volt signal. Similarly, a third bus bar assembly carries a +12 Volt signal from the power supply to the backplanes, and a fourth bus bar assembly provides a return path (i.e., Ground for the +12 Volt signal.

In the above-described data storage system, the power supply pads on the back of each backplane have a symmetrical arrangement. That is, each backplane has a first power supply signal pad for a first power supply signal along its midline (e.g., a +5 Volt signal pad). Each backplane further includes two second power supply signal pads which are symmetrically located on each side of the first power supply signal pad for a second power supply signal (e.g., a pad for return of the +5 Volt signal), two third power supply signal pads symmetrically located outside the second power supply signal pads for a third power supply signal (e.g., a +12 Volt signal pad), and so on.

Because of the symmetrical pad arrangement of the above-described backplanes the manufacturer of the above-described data storage system can manufacture the data storage system using a single backplane design for both the first backplane and the second backplane. For a bus bar assembly that connects to the pads on the midlines of the backs of the first and second backplanes, the conductive bracket of that bus bar assembly connects to those pads. For all other bus bar assemblies the conductive bracket of each bus bar assembly extends from the vertical conductive beam of that bus bar assembly to a pad on the left-hand side of the first backplane and to a symmetrically located pad on the right-hand side of the second backplane. The pads on the right-hand side of the first backplane and the pads on the left-hand side of the second backplane go unused. For example the bus bar assembly for the second power supply signal connects to the second power supply signal pad on the left-hand side of the first backplane and to the second power supple signal pad on the right-hand side of the second backplane the second power supply signal pad on the right-hand side of the first backplane and the second power supply signal pad on the left-hand side of the second backplane go unused.

SUMMARY OF THE INVENTION

Unfortunately, there are deficiunciels to the above-described conventional data storage system. For example, since the conductive bracket of each bus bar assembly of the conventional data storage system includes a single row of holes which align with a corresponding row of holes in the vertical conductive beam of that bus bar assembly there is little flexibility in the bus bar assembly design. In particular the conductive bracket is limited to properly connecting with the vertical conductive beam at a single location of the conductive bracket. Such a limitation restricts the placement of the vertical conductive beams when multiple bus bar assemblies are used together, i.e., the vertical conductive beams of the bus bar assemblies must extend in a plane in a parallel manner so that then do not interfere with each other.

Additional, due to the symmetrical pad arrangement of that data storage system which enables the manufacturer to use a single backplane design, some power supply pads of the first and second backplanes go unused resulting in an inefficient use of backplane space. Unnecessary costs are invested in making sure such pads are manufactured properly even though such features are never utilized.

Furthermore, the above-described parallel configuration of the bus bar assemblies through to middle of the electronic equipment cabinet is suitable only if the space in the middle of the cabinet between the power supply and the two backplanes is available. That is, the bus bar assembly configuration having vertical conductive beams which fasten to a power supply at the bottom of the cabinet, extend in parallel through the middle of the cabinet, and fasten to the top of the cabinet may not be suitable for situations that do not provide space in the middle of the cabinet between the power supply and the two backplanes.

Also, the bus bar assemblies in the above-described data storage system require attachment to the top of the cabinet for support. Such a requirement can be difficult or even impossible to meet due to the placement of various other components within the cabinet. Moreover, even if such a requirement were achievable, such a requirement can be expensive and burdensome both as a design requirement and a manufacturing requirement.

In contrast to the above-described conventional data storage system, the present invention is directed to techniques for connecting a power supply to multiple backplanes using a bus bar assembly having a power supply member that couples to the power supply, and a backplane member that couples simultaneously to the multiple backplanes. The backplane member defines multiple rows of holes (each row having at least two holes) enabling the power supply member to connect with the backplane member in one of multiple locations of the backplane member. With this configuration there is improved flexibility (e.g., the backplane member can be reused in one of a variety of different bus bar assembly designs). Such flexibility facilitates alleviating some of the deficiencies of the above-described conventional bus bar assembly design (e.g., vertical conductive beams passing through the middle of the cabinet fastening the vertical conductive beams to the lop of the cabinet etc.).

One arrangement of the invention is directed to an electronic system having a power supply, multiple backplanes, and a bus bar assembly electrically interconnected between the power supply and the multiple backplanes. The bus bar assembly includes a power supply member that couples to a power supply, and a backplane member that couples simultaneously to multiple backplanes. The backplane member defines multiple rows of holes. Each row of holes includes at least two holes. The bus bar assembly further includes a set of fasteners that fasten the power supply member to the backplane member in order to provide a conductive path between the power supply and the multiple backplanes. The multiple rows of holes defined by the backplane member enable the backplane member to fasten to power supply members having different designs for greater flexibility.

In one arrangement, the backplane member of the bus bar assembly defines as the multiple rows of holes an N×M array of holes. Here, each of N and M are positive integers greater than or equal to two (e.g., a 4-by-4 hole array). In one arrangement the set of fasteners of the bus bar assembly insert through a row of holes defined by the power supply member and one of N rows of M holes in the N×M array of holes defined by the backplane member (e.g., one or four different locations on the backplane member). In one arrangement, the backplane member of the bus bar assembly defines each of the multiple rows of holes in a substantially horizontal direction.

In one arrangement, the power supply member of the bus bar assembly includes a first end portion that couples to the power supply, and a second end portion that fastens to the backplane member. Accordingly, the power supply member is not required to fasten to the top of a cabinet as in the conventional data storage system which requires the vertical conductive beams of its bus bar assemblies to fasten to the top of cabinet.

In one arrangement, the power supply member of the bus bar assembly further includes an intermediate portion that connects the first and second end portions. The intermediate portion extends in a substantially vertical direction. Additionally the second end portion that fastens to the backplane member extends in a substantially horizontal direction. This arrangement is suitable for use when there is not a direct path between the power supply and the backplanes (e.g., when there is no space available in the middle of the cabinet between the power supply and the backplanes). For example, in contrast to the above-described conventional data storage system the conductive pathway provided by the bus bar assembly can extend around a periphery of the cabinet space. In one arrangement, the intermediate portion is configured to couple to a side of an electronic equipment cabinet. Preferably, an insulation member to separates the intermediate portion of the power supply member of the bus bar assembly and the side of the electronic equipment cabinet.

The features of the invention as described above may he employed in electronic systems (e.g., computer systems, data storage systems etc.) devices and methods as well as by other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to sale, emphasis instead being placed upon illustrating the principles of the invention.

DETAILED DESCRIPTION

The invention is directed to techniques for connecting a power supply to multiple backplanes using a bus bar assembly having a power supply member that couples to the power supply and a backplane member that couples simultaneously to the multiple backplanes. The backplane member defines multiple rows of holes (each row having at least two holes) enabling the power supply member to connect with the backplane member in one of multiple locations of the backplane member for greater flexibility (e.g., so that the backplane member can be reused in one of a variety of different bus bar assembly designs). Such flexibility facilitates alleviating some of the deficiencies of the above-described conventional bus bar assembly design (e.g., vertical conductive beams passing through the middle of the cabinet fastening the vertical conductive beams to the top of the cabinet etc.).

Figure 1:
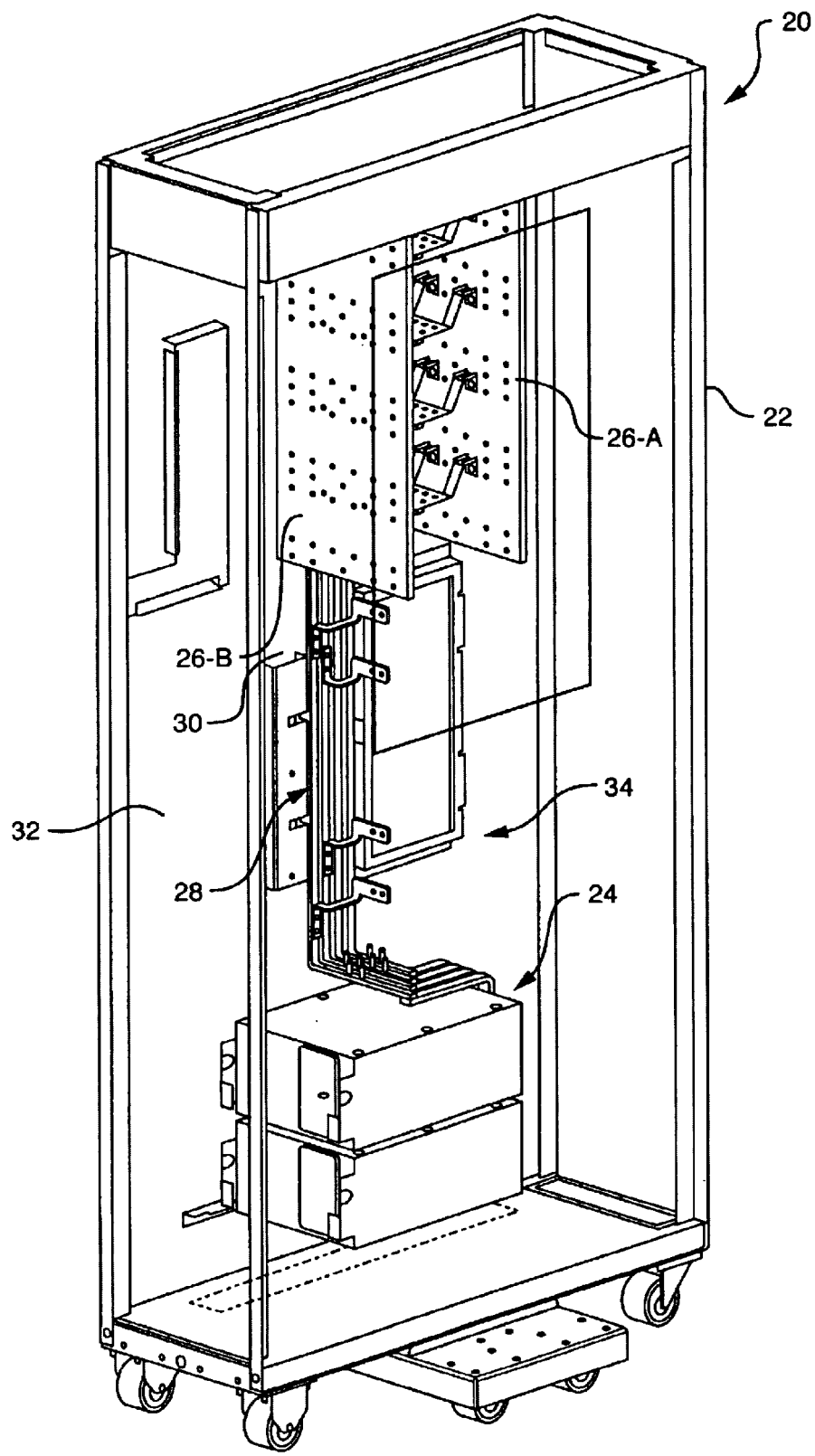
FIG. 1 is a perspective view of an electronic system which is suitable for use by the invention.

FIG. 1 shows a perspective view of an electronic system 20 (e.g., a data storage system) which is suitable for use by the invention. The electronic system 20 includes an electronic equipment cabinet 22, a power supply 24 located adjacent a bottom of the cabinet 22, multiple backplanes 26-A, 26-B (collectively, backplanes 26) located adjacent a top of the cabinet 22 and a set of bus bar assemblies 28 which electrically connect the power supply 24 with the backplanes 26.

The electronic system 20 further includes an insulation member 30 disposed between the bus bar assemblies 28 and a side 32 of the cabinet 22. Accordingly the bus bar assemblies 28 can fasten to the insulation member 30 and the side 32 of the cabinet 22 for support without making direct electrical contact with the side 32 of the cabinet 22

It should he understood that the bus bar assemblies 8 are not required to pass directly through a middle 34 of the cabinet 22 as is required in the earlier-described conventional data storage system. Accordingly the space between the power supply 24 and the backplanes 26 (i.e., the middle 34 of the cabinet 22) is available for housing various other components (e.g., a card cage is for circuit boards a disk cage for disk drives etc.) and such components can connect with the bus bar assemblies 28 to derive power. Further details of the invention will now be provided with reference to FIG. 2.

Figure 2:
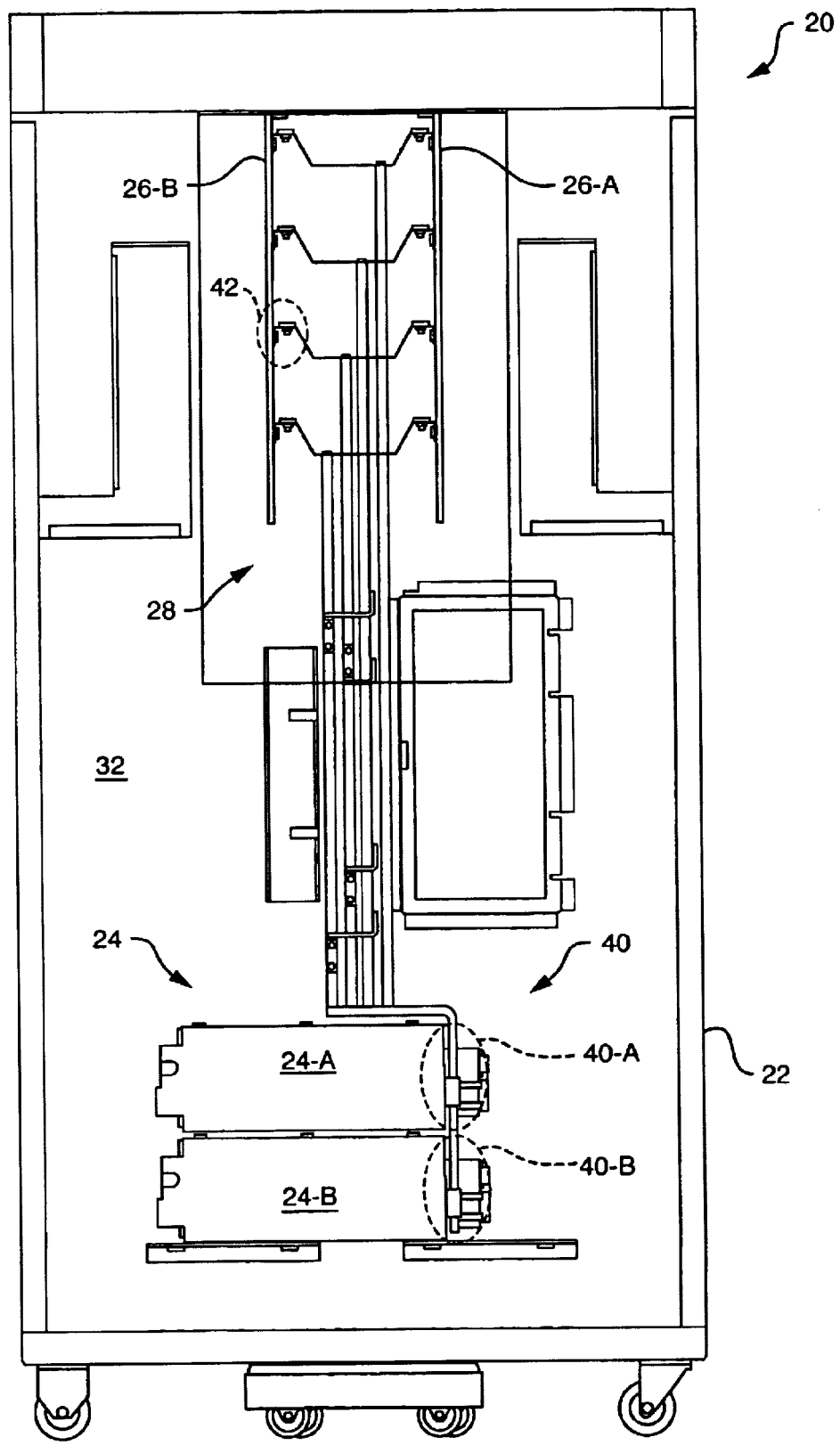
FIG. 2 is a side view of the electronic system of FIG. 1.

FIG. 2 shows a side view of the electronic system 20. As shown ends of the bus bar assemblies 28 connect with the power supply 24 at the bottom of the cabinet 22. In particular the bus bar assemblies 28 fasten to connecting locations 40 of the power supply 24. By way of example only the power supply 24 includes redundant power supply units 24-A, 24-B for fault tolerance and the bus bar assemblies 28 fasten to respective connecting locations 40-A, 40-B.

As further shown, the backs of the backplanes 26-A, 26-B face each other, and other ends of the bus bar assemblies 28 connect with the back of the backplanes 26-A, 26-B, in partictilar, each bus bar assembly 28 simultaneously fastens to the backs of both backplanes 26-A, 26B at respective locations 42. By way of example only a set of fasteners (e.g., screws bolts, etc.) attach the bus bar assemblies 28 to the backplanes 26. Further details of the invention will now be provided with reference to FIG. 3.

Figure 3:
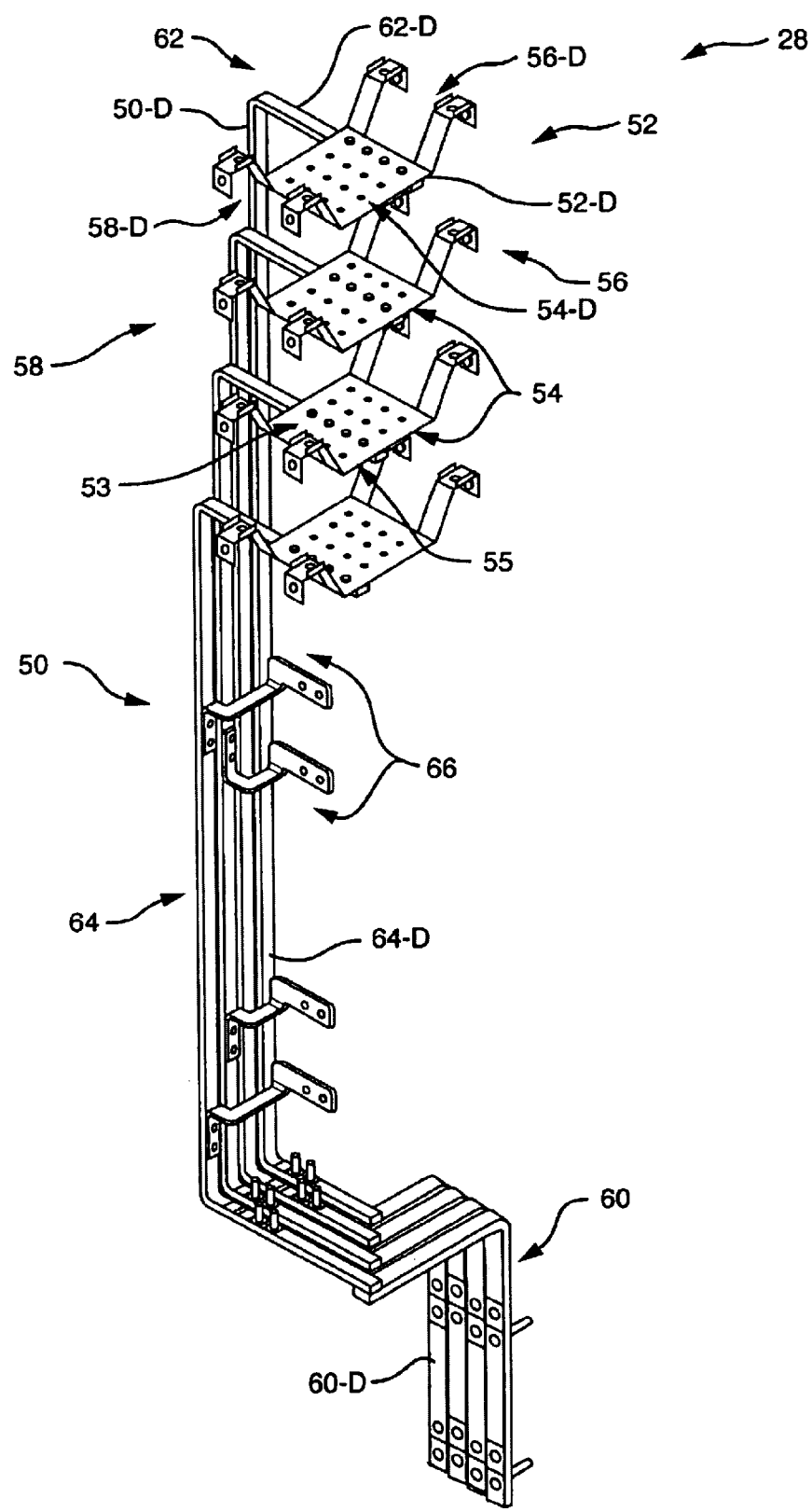
FIG. 3 is a perspective of a set of bus bar assemblies of the electronic system of FIG. 1.

FIG. 3 shows a perspective view of the bus bar assemblies 28. Each bus bar assembly 28 has a slightly different design and includes a power supply member 50 (e.g., a power supply member 50-D) that couples to the power supply 24 (see also FIGS. 1 and 2) and a backplane member 52 (e.g., the backplane member 52-D) that couples to the backplanes 26. The backplane member 52 of each bus bar assembly 28 defines multiple rows of holes 54 (e.g., an N×M array of holes 54) which align with corresponding holes defined by the power supply member 50 of that bus bar assembly 28 so that a set of fasteners 53 (e.g. screws, bolts, etc.) can attach the backplane member 52 to the power supply member 50. For example, the backplane member 52-D defines a 4×4 array of holes 54-D.

As shown in FIG. 3. the power supply member 50 of each bus bar assembly 28 fastens to a location 55 i.e., a particular row 55 of the multiple rows of holes 54 of the backplane member 52 of that bus bar assembly 28. In particular for the set of bus bar assemblies 28 each power supply member 50 fastens to a different location 55 on a perspective backplane member 52. i.e., in a staggered configuration. In this manner a single backplane member design can he used for each bus bar assembly 28 and the multiple rows of holes 54 on the backplane member 52 provides attachment flexibility. With such flexibility the placement of the power supply members 52 is not restricted to a plane as the vertical conductive beams are in the earlier-described conventional data storage system.

Additionally as shown in FIG. 3. each backplane member 52 defines a set of first extension portions 56 for attaching to the backplane 26-A and a set of second extension portions 58 for attaching to the backplane 26-B, i.e., for contacting power supply pads the backplanes 26-A. 26-B. For example, the backplane member 52-D) defines a set of first extension potions 56-D, and a set of second extension portions 58-D). With this arrangement the backplane members 52 can attach to both a left-hand side and a right-hand side of each backplane 26. Accordingly, if the manufacturer of the backplanes 26 wishes to use a single backplane design for each backplane 26 the manufacturer does not need to leave particular power supply pads unused. For example, the manufacturer can use a single backplane design for both of backplanes 26-A and 26-B.

Furthermore, as shown in FIG. 3, the power supply member 50 of each bus bar assembly 28 has a first end portion 60, a second end portion 62, and an intermediate portion 64. The first end portion 60 of each power supply member 50 (e.g., the first end portion 60-D) is configured to mount to the power supply 24 (e.g., defines holes for attaching to the power supply 24 using screws). Similarly, the second end portion 62 of each power supply member 50 (e.g., the second end portion 62-D) is configured to mount to a backplane member 52 (e.g., defines holes for attaching to a backplane member 52 using screws). The intermediate portion 64 of each power supply member 50 (e.g., the intermediate, portion 64-D) is configured to attach to the side 32 of the cabinet 22 (e.g., defines holes for fastening to the side 32 using screws) but is electrically insulated from the side 32 by the insulation member 30 (also see FIG. 1). Further details of the invention will now be provided with reference to FIG. 4.

Figure 4:
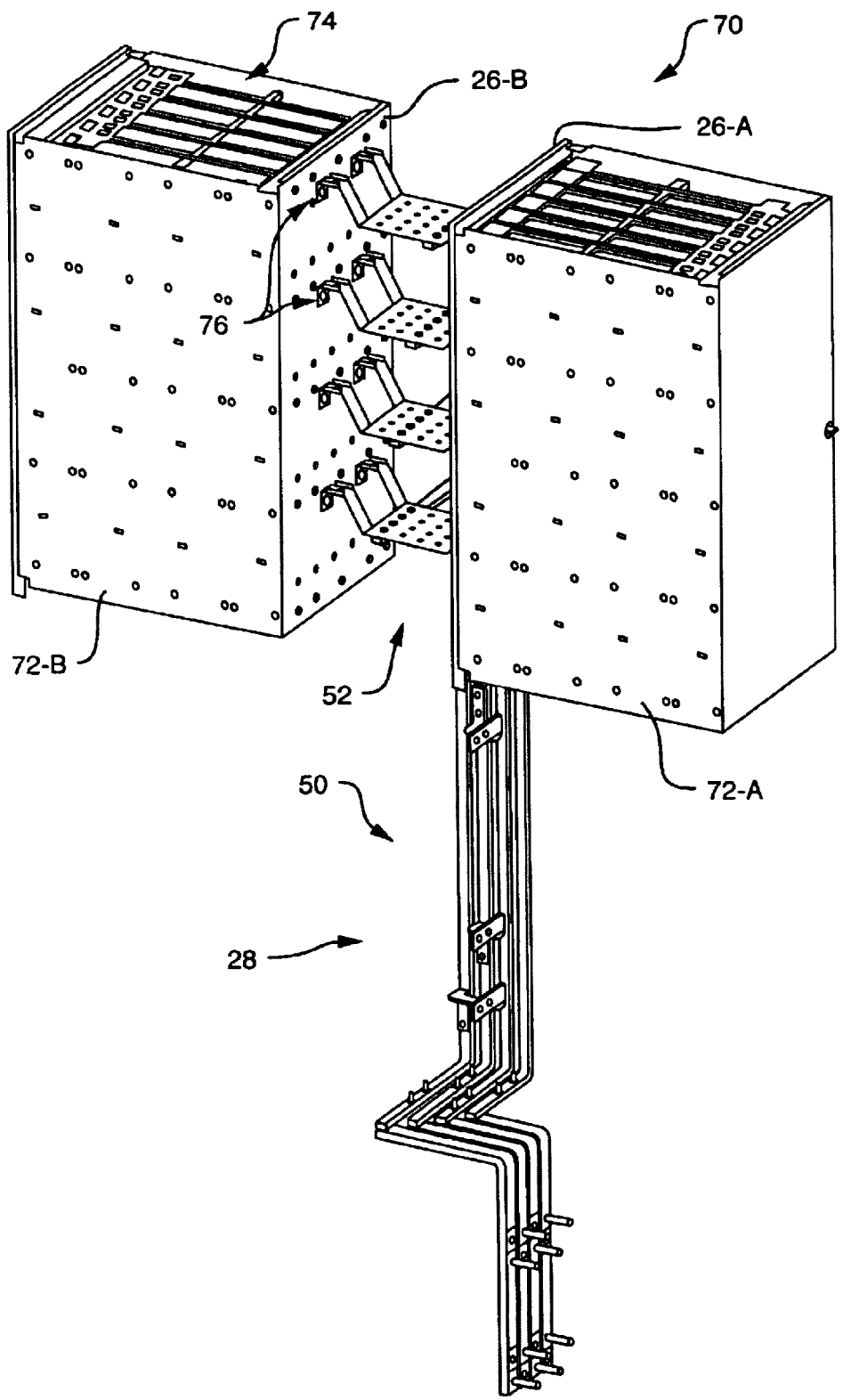
FIG. 4 is a perspective view of a portion of the electronic system of FIG. 1 which includes the bus bar assemblies of FIG. 3 and a set of disk cages.

FIG. 4 shows a perspective view of the portion 70 of the electronic system 20. The portion 70 includes the set of bus bar assemblies 28, the backplanes 26, and disk drive cages 72-A. 72-B (collectively disk drive cages 72). The disk drive cages 72 are suitable for housing a set of disk drives 74. As shown the extension portions defined by the backplane members 52 attach to the backplanes using a set of fasteners 76 (e.g., screws, bolts, etc.) thus enabling the set of bus bar assemblies 28 to power a set of disk drives 74 within the disk drive cages 72.

Figure 5:
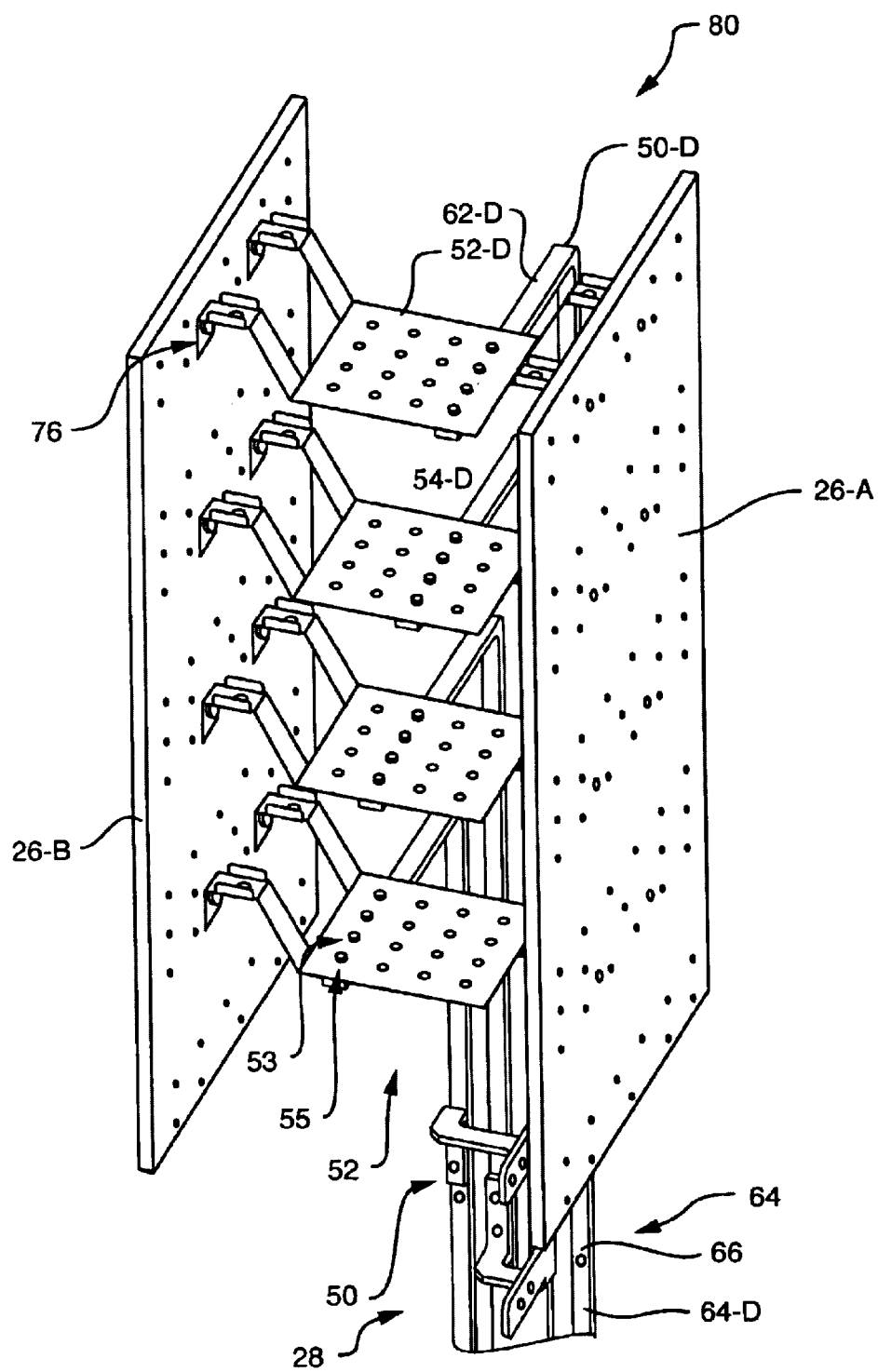
FIG. 5 is a perspective view of a portion of the electronic system of FIG. 1 including the bus bar assemblies and multiple backplanes.
Figure 6:
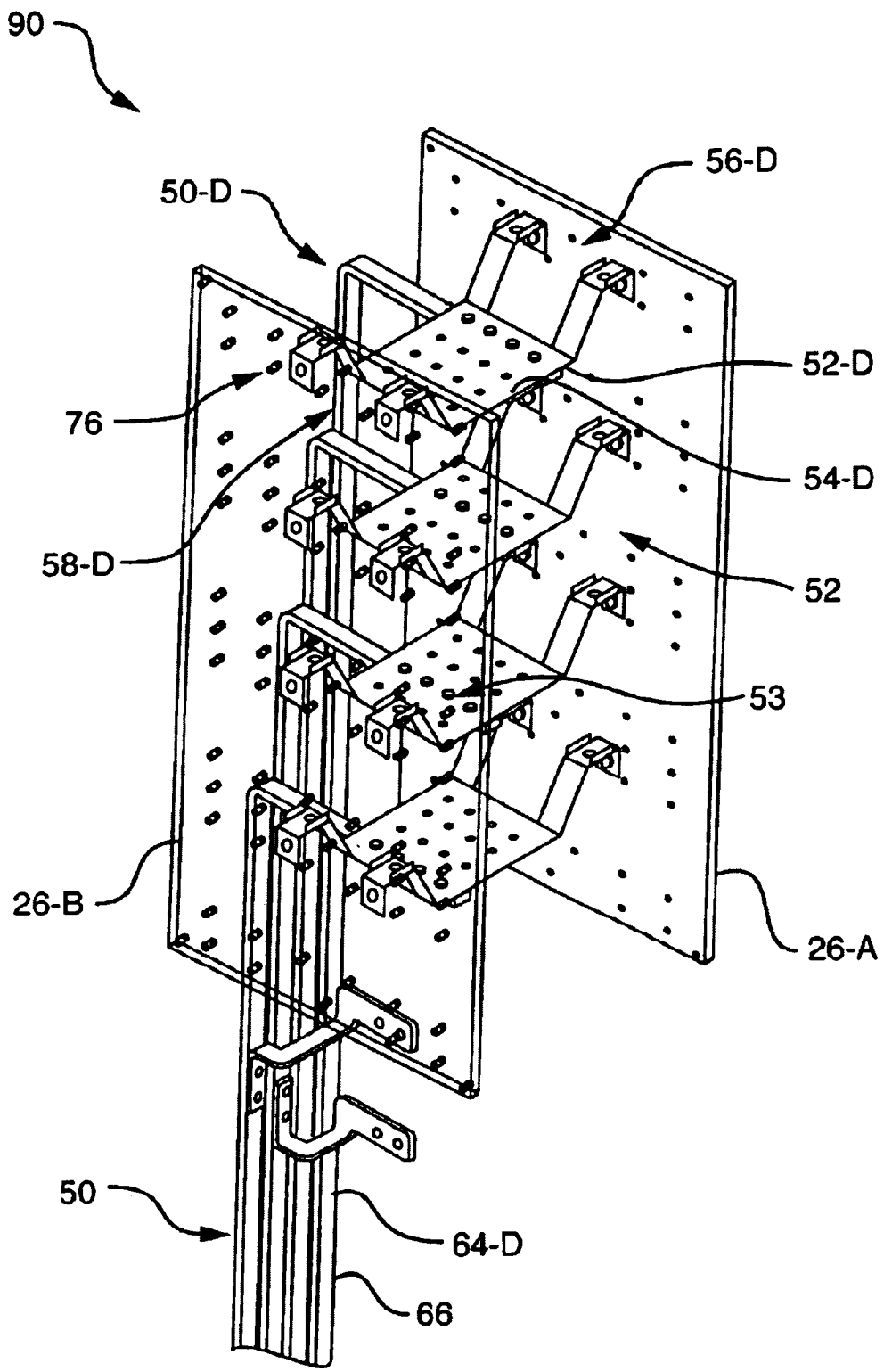
FIG. 6. is a reverse angle view of the portion of the electronic system of FIG. 5.

FIGS. 5 and 6 show perspective views 80, 90 of portions of the electronic system 20. FIG. 6 is essentially a reverse angle view of FIG. 5(i.e., from the left-hand side rather than the right-hand side). The backplane 26-B is transparent in FIG. 6. As shown the set of fasteners 76 fasten the bus bar assemblies 28 to the backplanes 26. As further shown the set of fasteners 53 fasten the backplane members 52 of the bus bar assemblies 28 to the power supply members 50.

It should he understood that the intermediate portions 64 (e.g., intermediate portion 64-D) of the power supple members 50 are substantially vertical and the end portions 62 (e.g., end portion 62-D) are substantially horizontal when the bus bar assemblies 28 are installed within the cabinet 22 (also see FIGS. 1 and 2). With this configuration the backplane member design can be reused in one of a variety of different bus bar assembly designs and can alleviate some of the deficiencies of the earlier-described conventional bus bar assembly design (e.g., vertical conductive beams passing through the middle of the cabinet fastening the vertical conductive beams to the top of the cabinet etc.). For example in contrast to the above-described conventional data storage system the conductive pathways provided by the bus bar assemblies 28 can extend along a periphery of the cabinet space (rather than through the middle) thus enabling the electronic system designer to locate various other components (e.g., card cages of circuit boards) between the power supply 24 and the backplanes 26 (see FIG. 1). Further details of the invention will now he provided with reference to FIG. 7.

Figure 7:
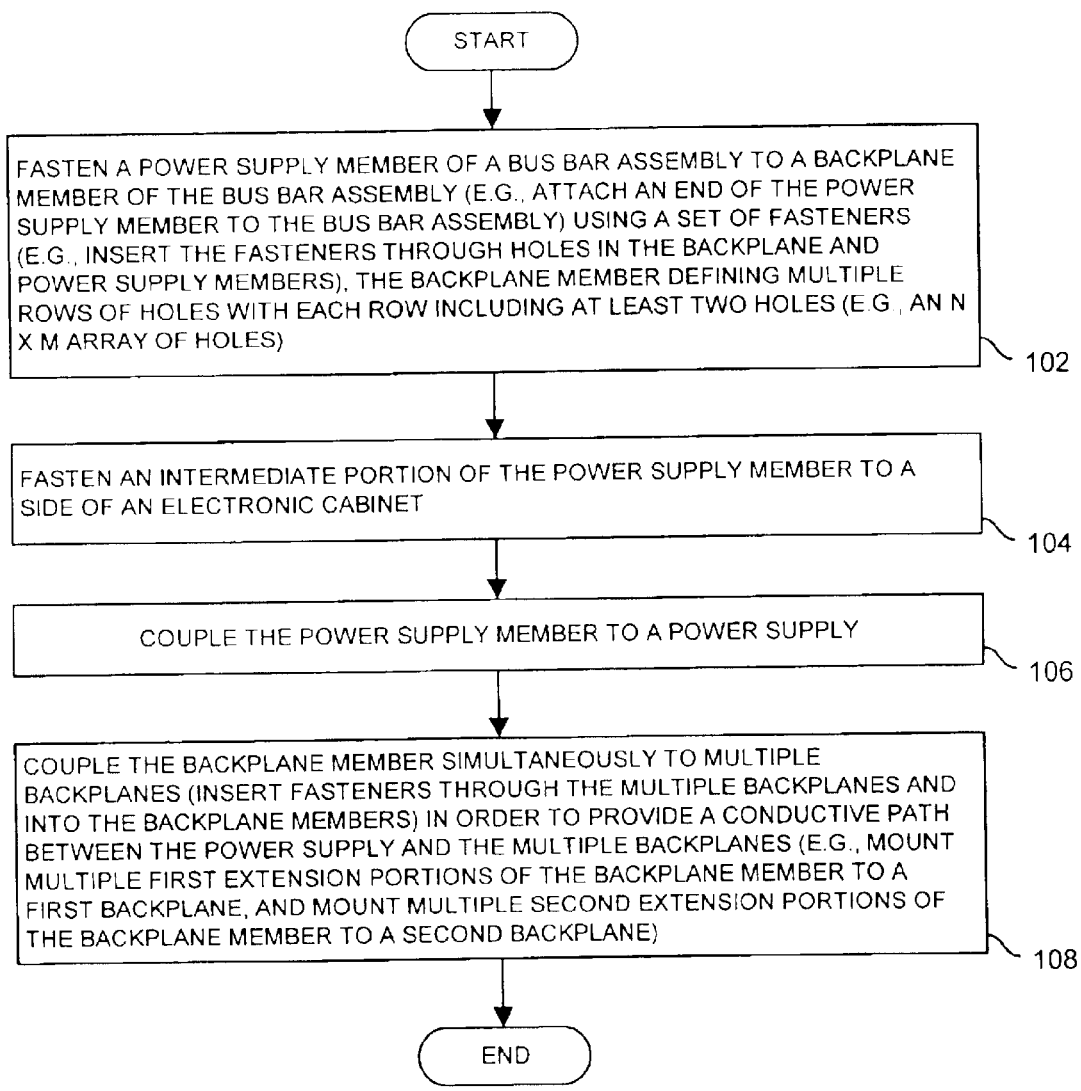
FIG. 7 is a flowchart of a procedure performed by a user of the electronic system of FIG. 1.

FIG. 7 shows a procedure 100 which is performed by a user of the electronic system 20. In step 102 the user fastens a power supply member 50 of a bus bar assembly 28 to a backplane member 52 of the bus bar assembly 28. That is the user attaches an end 62 of the power supply member 50 to one of multiple fastening locations 55 on the backplane member 52 using a set to fasteners 53. In particular the user inserts the fasteners 53 through one of multiple rows of holes 54 in the backplane member 52 and then into holes of the power supply member 50.

In step 104 the user fastens an intermediate portion 64 of the power supply member 50 to the side 32 of the electronic equipment cabinet 22. The insulation member 30 electrically separates the power supply member 50 from the side 32 of the cabinet 22.

In step 106 the user couples the power supply member 50 to the power supply 24. For example the user fastens the power supply member 50 to the power supply 24 using screws.

In step 108 the user couples the backplane member 52 to the backplanes 26. In particular the user inserts fasteners 76 through the backplanes 26 and the backplane member 52 (i.e., attaches each extension portion 56, 58 to one of the backplanes 26) so that the backplane member 52 is simultaneously coupled to the backplanes 26. Accordingly the bus bar assembly 28 now provides a conductive path between the power supply 24 and the multiple backplanes 26.

In one arrangement the user performs the procedure 100 on multiple bus bar assemblies 28 concurrently in order to provide multiple pathways between the power supply and the multiple backplanes 26 simultaneously (e.g., +5 Volts and return path. +12 Volts and return path etc.). In another arrangement the user performs the procedure 100 for one bus bar assembly 28 then repeals the procedure 100 for another bus bar assembly 28 and so on.

It should be understood that there is no requirement that the user fasten an portion of the bus bar assemblies 28 to the top of the cabinet for support. Rather, the bus bar assemblies 28 are allowed to extend along a periphery of the cabinet interior (rather than forced through the middle of the cabinet) and tile ends of the bus bar assemblies 28 attach to the backplanes 26. Accordingly the bus bar assemblies 28 can derive ample support from the attachment locations on the power supply 24 the backplanes 26 and the side 32 of the cabinet 22 alleviating the need to attach the bus bar assemblies 28 to the top of the cabinet 22.

As described above the invention is directed to techniques for connecting a power supply 24 to multiple backplanes 26 using a bus bar assembly 28 having a power supply member 50 that couples to the power supple 24 and a backplane member 52 that couples simultaneously to the multiple backplanes 26. The backplane member 52 defines multiple rows of holes 54 (each row having at least two holes) enabling the power supply member 50 to connect with the backplane member 52 in one of multiple locations 55 of the backplane member 52 for improved flexibility (e.g., so that the backplane member 52 can be reused in one of a variety of different bus bar assembly designs. Such flexibility alleviates some of the deficiencies of the above-described conventional bus bar assembly design (e.g., vertical conductive beams passing through the middle of the cabinet fastening the vertical conductive beams to the top of the cabinet etc.). The features of the invention as described above may be employed in computerized systems (e.g., computer systems data storage systems etc.) components and procedures such as those of EMC Corporation of Hopkinton, Mass.

While this invention has been particularly shown and described with references to preferred embodiments thereof it sill be understood by those skilled in the art that various changes in form and details may be made therein without departing from the spirit and scope of the invention as defined by the appended claims.

For example the electronic system 20 at as described above as a data storage system by way of example only. In other arrangements the electronic system 20 is a different type of system such as a general purpose computer system the specialized server a data communications device a system containing specialized electronic hardware for performing specific functions etc.

Additionally the sets of fasteners 53 which fasten the power supply members 50 to the backplane members 52 were described above as screws or bolts by way of example only. It should be of his understood that other types of fasteners arc suitable for use as well such as rivets, the hosts, brackets, welds, etc. and various combinations thereof.

Furthermore it should be understood that the backplane members 52 ere described above as defining a 4×4 array of holes by ay of example only. Other configurations are suitable for use as well such as a 6×4 array of holes for use with six bus bar assemblies (each bus bar assemble being capable of having a slightly different design in contrast to the conventional data storage system which uses the same design for each bus bar assembly) a 2×4 array of holes for use with two bus bar assemblies and so on.

It should he further understood that the power supply members 50 were shown as attaching to the backplane members 52 using four fasteners 53. Other numbers of fasteners 53 are suitable as well such as three five etc.

What is claimed is:

1. A bus bar assembly, comprising:
   a power supply member that couples to a power supply;
   a backplane member that couples simultaneously to multiple backplanes, the backplane member defining multiple rows of holes, each row of holes including at least two holes; and
   a set of fasteners that fasten the power supply member to the backplane member in order to provide a conductive path between the power supply and the multiple backplanes.

2. The bus bar assembly of claim 1 wherein the backplane member defines, as the multiple rows of holes, an N×M array of holes, and wherein each of N and M are positive integers greater than or equal to two.

3. The bus bar assembly of claim 2 wherein the set of fasteners insert through a row of holes defined by the power supply member and one of N rows of M holes in the N×M array of holes defined by the backplane member.

4. The bus bar assembly of claim 1 wherein the backplane member defines each of the multiple rows of holes in a substantially horizontal direction.

5. The bus bar assembly of claim 1 wherein the power supply member includes:
   a first end portion that couples to the power supply; and
   a second end portion that fastens to the backplane member.

6. The bus bar assembly of claim 5 wherein the power supply member further includes:
   an intermediate portion that connects the first and second end portions; wherein the intermediate portion extends in a substantially vertical direction; and wherein the second end portion that fastens to the backplane member extends in a substantially horizontal direction.

7. The bus bar assembly of claim 5 wherein the power supply member further includes:
   an intermediate portion that connects the first and second end portions; and wherein the intermediate portion is configured to couple to a side of an electronic equipment cabinet.

8. The bus bar assembly of claim 1 wherein a portion of the bus bar assembly is configured to couple to a side of an electronic equipment cabinet.

9. The bus bar assembly of claim 1 wherein the backplane member is configured to (i) reside between a first backplane and a second backplane, the first and second backplanes being substantially parallel to each other, and (ii) electrically connect each of the first and second backplanes.

10. The bus bar assembly of claim 1 wherein each backplane of the multiple backplanes includes a first power supply signal pad configured to receive a first power supply signal and a second power supply signal pad configured to receive a second power supply signal that is different than the first power supply signal, and wherein the backplane member is configured to electrically connect to the first power supply signal pad of each backplane while being electrically isolated from the second power supply signal pad of each backplane.

11. An electronic system, comprising:
a power supply;
multiple backplanes; and
a bus bar assembly electrically interconnected between the power supply and the multiple backplanes, the bus bar assembly including:
a power supply member that couples to a the power supply;
a backplane member that couples simultaneously to the multiple backplanes, the backplane member defining multiple rows of holes, each row of holes including at least two holes; and
a set of fasteners that fasten the power supply member to the backplane member in order to provide a conductive path between the power supply and the multiple backplanes.

12. The electronic system of claim 11 wherein the backplane member of the bus bar assembly defines, as the multiple rows of holes, an N×M array of holes, and wherein each of N and M are positive integers greater than or equal to two.

13. The electronic system of claim 12 wherein the set of fasteners of the bus bar assembly insert through a row of holes defined by the power supply member and one of N rows of M holes in the N×M array of holes defined by the backplane member.

14. The electronic system of claim 11 wherein the backplane member of the bus bar assembly defines each of the multiple rows of holes in a substantially horizontal direction.

15. The electronic system of claim 11 wherein the power supply member of the bus bar assembly includes:
a first end portion that couples to the power supply; and
a second end portion that fastens to the backplane member.

16. The electronic system of claim 15 wherein the power supply member of the bus bar assembly further includes:
an intermediate portion that connects the first and second end portions; wherein the intermediate portion extends in a substantially vertical direction; and wherein the second end portion that fastens to the backplane member extends in a substantially horizontal direction.

17. The electronic system of claim 15 wherein the power supply member of the bus bar assembly further includes:
an intermediate portion that connects the first and second end portions; and wherein the intermediate portion is configured to couple to a side of an electronic equipment cabinet.

18. The electronic system of claim 17, further comprising:
an insulation member configured to separate the intermediate portion of the power supply member of the bus bar assembly and the side of the electronic equipment cabinet.

19. The electronic system of claim 11 wherein a portion of the bus bar assembly is configured to couple to a side of an electronic equipment cabinet.

20. The electronic system of claim 11 wherein the backplane member is configured to (i) reside between a first backplane and a second backplane, the first and second backplanes being substantially parallel to each other, and (ii) electrically connect each of the first and second backplanes.

21. The electronic system of claim 11 wherein each backplane of the multiple backplanes includes a first power supply signal pad configured to receive a first power supply signal and a second power supply signal pad configured to receive a second power supply signal that is different than the first power supply signal, and wherein the backplane member is configured to electrically connect to the first power supply signal pad of each backplane while being electrically isolated from the second power supply signal pad of each backplane.

22. A method for electrically connecting a power supply to multiple backplanes, the method comprising the steps of:
fastening a power supply member, which is configured to couple to the power supply, to a backplane member, which is configured to couple simultaneously to the multiple backplanes, using a set of fasteners in order to form a bus bar assembly, the backplane member defining multiple rows of holes, each row of holes including at least two holes;
coupling the power supply member of the bus bar assembly to the power supply; and
coupling the backplane member of the bus bar assembly simultaneously to the multiple backplanes in order to provide a conductive path between the power supply and the multiple backplanes.

23. The method of claim 22 wherein the backplane member defines, as the multiple rows of holes, an N×M array of holes, wherein each of N and M are positive integers greater than or equal to two; and wherein the step of fastening includes the step of:
inserting the set of fasteners through one of the multiple N rows of M holes defined by the backplane member and through the power supply member.

24. The method of claim 22 wherein the power supply member includes a first end portion that couples to the power supply, and a second end portion that fastens to the backplane member; and wherein the step of fastening includes the step of:
attaching the second end portion of the power supply member to the backplane member using the set of fasteners.

25. The method of claim 24 wherein the power supply member further includes an intermediate portion that connects the first and second end portions; and wherein the method further comprises the step of:
coupling the intermediate portion of the power supply member to a side of an electronic equipment cabinet.

26. The method of claim 25 wherein the step of coupling the intermediate portion of the power supply member to the side of the electronic equipment cabinet includes the step of:
positioning an insulation member between the intermediate portion of the power supply member of the bus bar assembly and the side of the electronic equipment cabinet.

27. The method of claim 22, further comprising the step of:

coupling a portion of the bus bar assembly to a side of an electronic equipment cabinet.

28. The method of claim 22 wherein the step of coupling the backplane member includes the steps of:

disposing the backplane member between a first backplane and a second backplane, the first and second backplanes being substantially parallel to each other; and electrically connecting the backplane member to each of the first and second backplanes.

29. The method of claim 22 wherein each backplane of the multiple backplanes includes a first power supply signal pad configured to receive a first power supply signal and a second power supply signal pad configured to receive a second power supply signal that is different than the first power supply signal, and wherein the step of coupling the backplane member includes the step of:

electrically connecting the backplane member to the first power supply signal pad of each backplane and leaving the backplane member electrically isolated from the second power supply signal pad of each backplane.

* * * * *